United States Patent [19]

Levine

[11] Patent Number: 4,499,482
[45] Date of Patent: Feb. 12, 1985

[54] WEAK-SOURCE FOR CRYOGENIC SEMICONDUCTOR DEVICE

[76] Inventor: Michael A. Levine, 383 Sycamore Pl., Sierra Madre, Calif. 91024

[21] Appl. No.: 392,081

[22] Filed: Jun. 25, 1982

Related U.S. Application Data

[63] Continuation-in-part of Ser. No. 333,465, Dec. 22, 1981, Pat. No. 4,433,433, and Ser. No. 357,866, Mar. 15, 1982.

[51] Int. Cl.³ .................................. H01L 27/14
[52] U.S. Cl. ........................... 357/30; 357/24; 357/58; 357/23
[58] Field of Search ................ 357/30, 30 I, 23.14, 357/24 LR, 23.1, 23.3, 23.12

[56] References Cited

U.S. PATENT DOCUMENTS

| | | | |
|---|---|---|---|
| 3,436,623 | 4/1969 | Beer | 357/23.14 X |
| 3,714,522 | 1/1973 | Komiya et al. | 357/23.14 |
| 3,786,319 | 1/1974 | Tomisaburo | 357/23.14 X |
| 4,028,719 | 6/1977 | Curtis | 357/30 |
| 4,142,198 | 2/1979 | Finnila et al. | 357/30 X |
| 4,166,223 | 8/1979 | Bluzer | 357/24 LR X |
| 4,241,358 | 12/1980 | Wade | 357/30 |
| 4,313,127 | 1/1982 | Su et al. | 357/30 |

Primary Examiner—Andrew J. James
Assistant Examiner—William A. Mintel
Attorney, Agent, or Firm—John M. May

[57] ABSTRACT

A two-gate field-effect transistor (FET) is designed to operate at cryogenic temperatures (circa 1°-20° K.). For an N channel FET, the low-concentration weak-P type material used for the channel region is built into an intrinsic (or near-intrinsic) layer which in turn is built on a P type substrate. The first gate corresponds to a conventional FET control gate. The second gate may be designated a weak-source gate and is directly above a corresponding weak-source region which is itself adjacent to the conventional (strong) source region. The weak-source gate is placed at a fixed positive potential with respect to the source region so that the electrons will collect in the conduction band within the weak-source region. Once the required fixed weak-source gate potential has been established, the control gate functions in a conventional manner even when the device is at a cryogenic temperature. Such a weak-source gate over a weak-source region may be utilized to inject carriers into a charge-coupled device, or any similar device, even at cryogenic temperatures. The device channel region can, alternatively, be made of the same non-conductive low concentration N type material as the weak-source region and can be the same as the material used for the absorption of infrared photons by the associated infrared detectors thus allowing the simultaneous epitaxial construction of both the FET/CCD electronics and the associated infrared detectors.

10 Claims, 6 Drawing Figures 4,499,482

WEAK-SOURCE FOR CRYOGENIC SEMICONDUCTOR DEVICE

CROSS REFERENCE TO RELATED APPLICATIONS

This application is a continuation in part of my prior U.S. patent applications respectively entitled "Extrinsic Infrared Detector with Dopant Site Charge-Neutralization", filed on Dec. 22, 1981 under Ser. No. 333,465 and now U.S. Pat. No. 4,433,433, and "Extrinsic Infrared Detector with a Charge Reset Function", filed on Mar. 15, 1982 under Ser. No. 357,866, which are both hereby incorporated by reference in their entirety.

TECHNICAL FIELD

The present invention relates generally to semiconductor devices and more particularly to field-effect transistors and charge-coupled devices that will function at the cryogenic temperatures to which "on-chip" and "on-the-focal-plane" infrared detector circuit elements may be subjected.

BACKGROUND OF THE INVENTION

A metal-oxide-semiconductor N channel field-effect transistor (FET) with a weak-P type channel region and an N channel charge-coupled device (CCD) both experience a similar phenomenon at cryogenic temperatures: when the control gate potential is increased there is still a residual potential barrier to electron flow through the conduction band. That potential barrier lies between the $N^-$ source and the P type region beneath the control gate. The potential barrier happens because electrons within the transition region between the source and channel feel the potential of the source more strongly than the potential of the more distant control gate which is on the other side of the oxide layer above the channel. This residual potential barrier prevents an FET from "turning on" and similarly prevents "charge-injection" into a CCD.

If the device were sufficiently warm then electrons would be thermally excited over the potential barrier as is the case for almost all FETs and CCDs at room temperature. However, at the cryogenic temperatures normally required for infrared detectors, the device temperature is often too low for thermal excitation over the potential barrier and thus the barrier effectively blocks any current flow.

Once sufficient current has been established in the FET channel then the FET will heat up by joule heating within the channel region and thus maintain a sufficiently high temperature that continued operation over the potential barrier is possible. Similarly, once charge is successfully injected into the first "bucket" of a CCD, it can then be readily moved to other buckets because there are no residual potential barriers between successive buckets. Therefore, several means of "turning on" a cryogenic FET or a cryogenic CCD have been tried.

One prior art turn-on technique is to apply a large potential to the FET's control gate. This lowers the height of the potential barrier in the same manner as when a high voltage potential is used to create field emission from a cold cathode in a vacuum. Because of the limited amount of field that can be placed cross the thin dielectric between the gate and the channel region, this technique can only change the potential barrier height by a small amount; thus not all types of cryogenically cooled FETs can accommodate a high enough gate potential to be turned on by this technique.

Once the FET has been so turned on, the FET's gate can then be returned to its normal operating range. If the current is turned completely off again, either intentionally or unintentionally, the gate will again have to be subjected to the above-mentioned high potential to again turn the FET on. This erratic off-again, on-again behavior is undesirable.

A second prior art technique is to heat the FET (or CCD). This results in electronics which are thermally incompatible with the infrared detectors with which the electronics is designed to work. The heated electronics must be on a separate chip (substrate) which is thermally isolated from the detectors and the detector heat sink. This also necessitates a chip-to-chip "cable" connection. Thus this second technique is complicated to implement and the extra chip-to-chip wiring is often a source of unreliability.

A third prior art technique is to shine a light onto the FET (or CCD). The absorbed light generates some free electrons which then flow through the channel, thus heating the FET until it turns on. The problem of localizing the light at the electronics and preventing stray light from interacting with the infrared detectors makes this third method incompatible with having the detectors and the electronics adjacent one another on the same chip, again requiring separate chips and chip-to-chip wiring.

SPECIFIC OBJECTIVES OF THE INVENTION

It is a primary object of the present invention to provide a mechanism at cryogenic temperatures for carrier injection from the source region of a semiconductor device into a channel region (or other analogous region such as a CCD "bucket") of a different conductivity type and effectively reduce the residual potential barrier at cryogenic temperatures between said regions.

A further object is to facilitate the fabrication and use of "on-chip" electronics with monolithic arrays of infrared detectors.

It is a related object of a particular preferred embodiment to utilize throughout the device a non-conductive low concentration of the same impurities as is used for the absorption of infrared photons by a detector associated with the device.

Reference to the above-referenced co-pending applications should be made for further background and other objectives which may also be relevant to the present invention.

BRIEF SUMMARY OF THE INVENTION

Briefly, the invention which is intended to achieve the above objects and such other similar and related objects as will become apparent from the appended Detailed Description and the Drawings may be summarized as follows.

A typical preferred embodiment of the invention is a two-gate field-effect transistor (FET) which is designed to operate at cryogenic temperatures (circa 1°–20°K.). The device is built up in layers on an underlying substrate with the gates defining a front surface and the substrate a rear surface. For an N channel FET, the low-concentration weak-P type material used for the channel region is built into an intrinsic (or near-intrinsic) layer which in turn is built on a P type substrate. The substrate acts as a rear channel stop which keeps the mobile electrons of the device near to the front surface so that electrons cannot stray randomly away from the gates even at cryogenic temperatures. The first gate corresponds to a conventional FET control gate. The second gate may be designated a weak-source gate and is directly above a corresponding weak-source region which is itself adjacent to the conventional (strong) source region, as will be described more fully below.

The weak-source gate is placed at a fixed positive potential with respect to the source region so that electrons will collect in the conduction band within the weak-source region. These electrons act as the real source and are not prevented by residual potential barriers from entering the channel region beneath the control gate. Once the required fixed weak-source gate potential has been established, the control gate functions in a conventional manner even when the device is at a cryogenic temperature.

In a similar fashion, such a weak-source gate over a weak-source region may be utilized to inject carriers into a charge-coupled device, or any similar device, even at cryogenic temperatures.

The channel region can, alternatively, be made of the same non-conductive low concentration N type material as the weak-source region. (In this case, the N type region is preferably separated from the P+ substrate by a thin intrinsic (or near-intrinsic) layer.) The advantage of this alternative configuration is that the N type material can be the same as the material used for the absorption of infrared photons by the associated infrared detectors thus allowing the simultaneous epitaxial construction of both the FET/CCD electronics and the associated infrared detectors. Such an alternatively constructed FET (or CCD) might function as a short circuit when at room temperature, but would operate properly when cooled to suitable cryogenic temperatures.

DETAILED DESCRIPTION OF THE PREFERRED EMBODIMENTS

Figure 1:
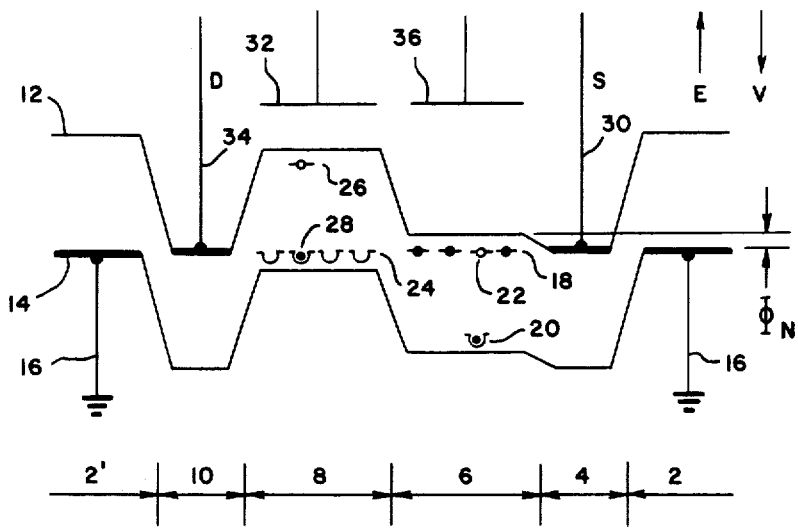
FIGS. 1 and 2 are energy band schematic diagrams of a first embodiment of an N channel field-effect transistor with a weak-source constructed in accordance with the present invention wherein a weak-P type material is used in the channel region, with FIG. 1 showing the initial condition with no potentials applied and FIG. 2 showing the device in the conductive condition.

The invention will now be described in detail with particular reference to certain presently preferred embodiments thereof so that the average artisan will better be able to make and use the invention, not only with respect to the embodiments such as is illustrated in the drawings but also with respect to such other embodiments as may be desirable or necessary for particular applications.

FIG. 1 is a schematic energy level diagram representation of an N channel field-effect transistor with a weak-source in accordance with the present invention for the case of a weak-P type material used in the channel region with the gates, sources, and drain in the initial condition with no potentials applied. The effective outer boundaries of the device are defined by the P− channel stop regions (2, 2'). A conventional (strong) source region (4) operates in conjunction with a weak-source region (6) to make a source of free carriers (electrons in the case of an N channel device as illustrated). A weak-P type channel region (8) connects the weak-source region (6) to the drain region (10).

The conduction band edge (12) of the host semiconductor is shown as a contour line moving through the device from one channel stop (2) to the other (2'). The energy levels (the arrow E pointing up to the higher energy levels) are drawn for electrons, hence the voltage potentials increase as one moves down on the diagram (as indicated by the arrow V pointing down to higher voltage potentials). The valence band edge (14) is shown for reference. The heavy line where the conduction band edge (12) passes through the drain region (10) and the conventional source region (4) symbolizes that the region is an N+ material. The heavy lines where the valence band edge (14) passes through the channel stops (2, 2') symbolizes that the stops are P− material. The channel stops are shown as electrically grounded (16) to provide a fixed reference point for the other voltage potentials present in the device.

The donor impurity band (18) in the weak-N type weak-source region (6) has an activation energy ($\Phi_N$). Because the device is cryogenicly cooled, the donor electrons are shown un-ionized (i.e., still located at the donor sites, rather than ionized and free within the conduction band). In any real N type material there are some residual acceptors (20) into which donor electrons are trapped (as shown) leaving behind some empty donor sites (22).

The acceptor impurity band (24) in the weak-P channel region (8) is shown without trapped electrons (the electrons are un-ionized, i.e., still in the valence band). In any real P type material there are some residual donors (26) from which electrons are trapped by acceptors (28) leaving the residual donors (26) empty.

The source connection (30), the drain connection (32), and the control gate (34) electrodes are the conventional field-effect transistor electrodes. The weak-source gate (36) electrode controls the potentials in the weak-source region (6).

Figure 2:
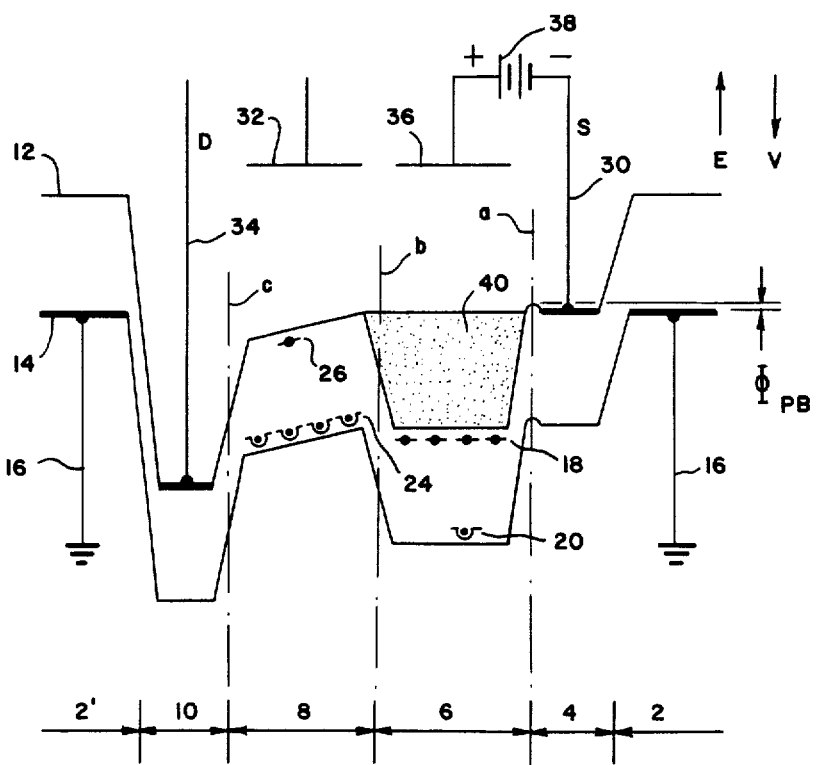

FIG. 2 shows the device of FIG. 1 with potentials applied to place the device in a conductive condition. A fixed positive potential (38) applied to the weak-source gate (36) with respect to the conventional source (30) lowers the energy level of the conduction band edge (12). This leaves a residual potential barrier ($\Phi_{PB}$) between the conventional source region (4) and the weak-source region (6). The height of the potential barrier ($\Phi_{PB}$) is readily made smaller than the activation energy ($\Phi_N$) of the donor band (18) by application of the positive potential (38). Hence, while electrons cryogenicly frozen into the donor band (18) cannot be thermally ionized into the conduction band (12) over the potential barriers ($\Phi_N$) of the donor band, nevertheless electrons in the conduction band of the source region (4) still are thermally ionized over the smaller potential barrier ($\Phi_{PB}$) and these thermally ionized electrons collect in a potential bucket (40) in the conduction band within the weak-source region (6). Note that some of these electrons have filled up the remaining donors which were previously empty (22 in FIG. 1).

The conduction and valence band edges (12 and 14) within the channel region (8) are shown tipped by the electric field caused by the potential difference between the donor band (18) within the weak-source region (6) and the conduction band (12) within the drain region (10). Electrons at the top of the collected electrons (40) in the conduction band of the weak-source region (6) flow through the conduction band of the channel region (8) into the drain (34). There is no potential barrier to electron flow at "b" between the weak-source region (6) and the channel region (8) for electrons at the top of the collected electrons (40) in the weak-source region (6) so long as the potential of the conduction band (12) at the "b" end of the chennel (8) is equal to or lower than the potential of the conduction band (12) in the conventional source region (4). This is accomplished by applying a positive potential to the control gate (32) with respect to the source (30). There is no potential barrier to electron flow at "c" for electrons flowing in the conduction band (12) from the channel region (8) into the drain (34) so long as the drain potential is positive with respect to the potential of the "c" end of the conduction band (12) in the channel region (8). Note that some of the flowing electrons have filled up the remaining donors (26) which were empty in FIG. 1.

Increasing the control gate (32) potential increases the current flow. Decreasing the control gate (32) potential decreases the current flow, even to blocking the current. The actual potentials used should also take into account the effects of the charge stored on the initially empty donor sites (22) within the donor band (18) of the weak-source region (6) and the charge stored on the initially empty residual donor sites (26) within the channel region (8).

Figure 3:
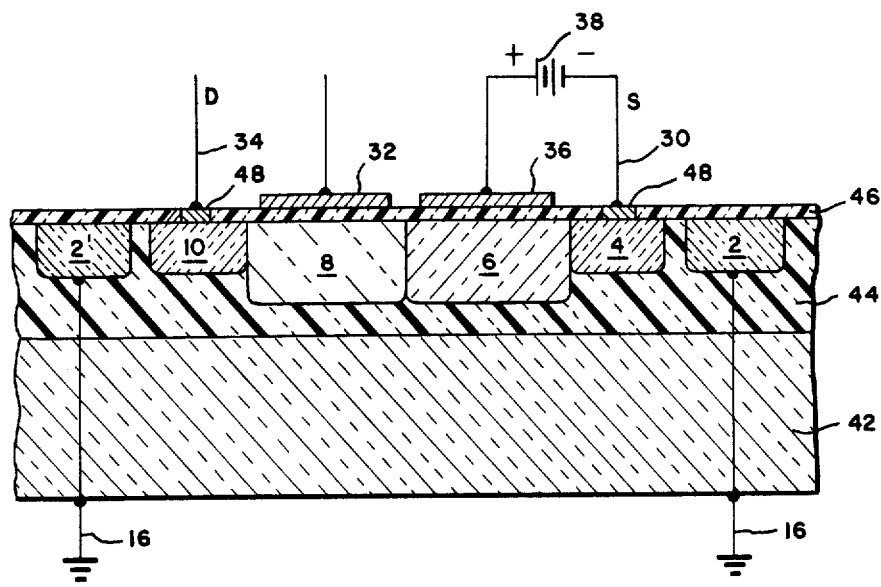
FIG. 3 is a schematic cross-section diagram of the device of FIGS. 1 and 2.

FIG. 3 is a schematic cross-section diagram through the device described functionally above with reference to FIGS. 1 and 2. The device is built up in layers on an underlying P+ type substrate (42) which forms the rear of the device. The outer limits of the device are defined to lie within the intrinsic (or near-intrinsic) layer (44) which may be epitaxially grown onto the substrate (42). The substrate acts as a rear channel stop. Note that good practice dictates that the channel stops (2, 2') are not contiguous with either the source region (4) or the drain region (10) so as not to have any unwanted tunnelling conduction effects due to having P+ material adjacent to N+ material.

The weak-N type material which forms the weak-source region (6) is built into the intrinsic layer (44) by diffusion, ion implantation, or such other equivalent method as the fabricator may choose. Alternatively, the intrinsic layer (44) may be constructed of the same weak-N type material as the weak-source region (6) in which case both the intrinsic layer (44) and the weak-source region (6) may be constructed epitaxially simultaneously.

The weak-P type material which forms the channel region (8) is built into the intrinsic layer (44) by diffusion, ion implantation, or such other equivalent method as the fabricator may choose. Alternatively, the intrinsic layer (44) may be constructed of the same weak-P type material as the channel region (8) in which case both the intrinsic layer (44) and the channel region (8) may be constructed epitaxially simultaneously.

A dielectric layer (46), typically an oxide of the intrinsic layer (44), is grown across the device. The source (30) and drain (34) electrodes connect through the dielectric layer (46). Typically these connections (48) will be metallic but they could be constructed using N+ type material or such other equivalent material as the fabricator may choose.

The control gate (32) is shown atop the dielectric layer (46) above the channel region (8). The weak-source gate (36) is also shown atop the dielectric layer (46) above the weak-source region (6). These gate electrodes (32 and 34) are typically metallic but can be constructed using strongly conductive semiconductors or such other equivalent material as the fabricator may choose.

The positive potential (38) is applied between the source (30) and the weak-source gate (36) by any suitable external instrument such as a battery or a power supply.

Figure 4:
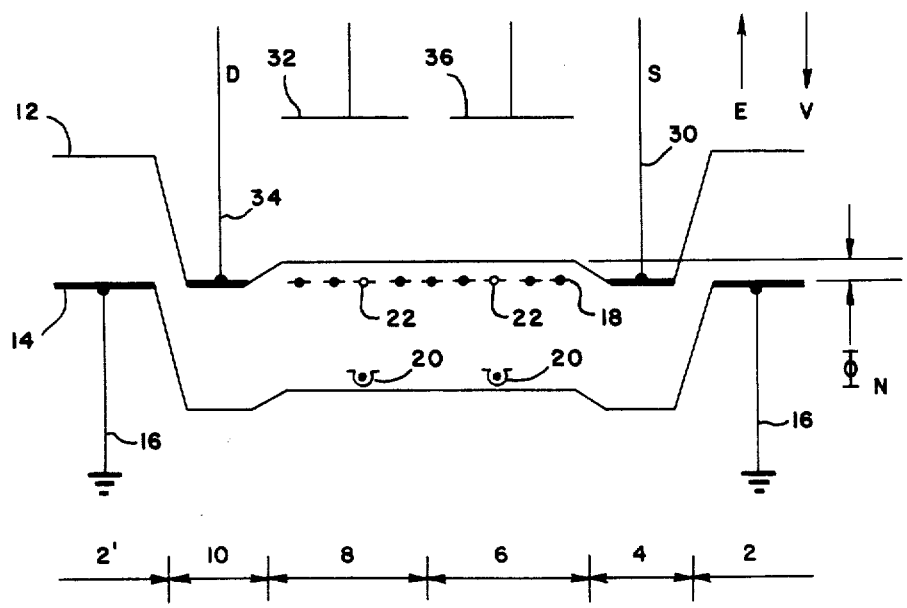
FIGS. 4 and 5 are energy band schematic diagrams of an alternative embodiment of an N channel field-effect transistor with a weak-source constructed in accordance with the present invention wherein a non-conductive low concentration N type material is used in the channel region with FIG. 4 showing the initial condition with no potentials applied and FIG. 5 showing the device in the conductive condition.

FIG. 4 is a schematic energy level diagram representation of an N channel field-effect transistor with a weak-source constructed in accordance with the present invention for the alternative case of a non-conductive low concentration N type material used in the channel region with the gates, sources and drain in the initial condition with no potentials applied.

The donor impurity band (18) in this configuration extends throughout the weak-N type weak-source region (6) and the channel region (8). In fact, the donor impurity band (18) may extend throughout the entire device.

Figure 5:
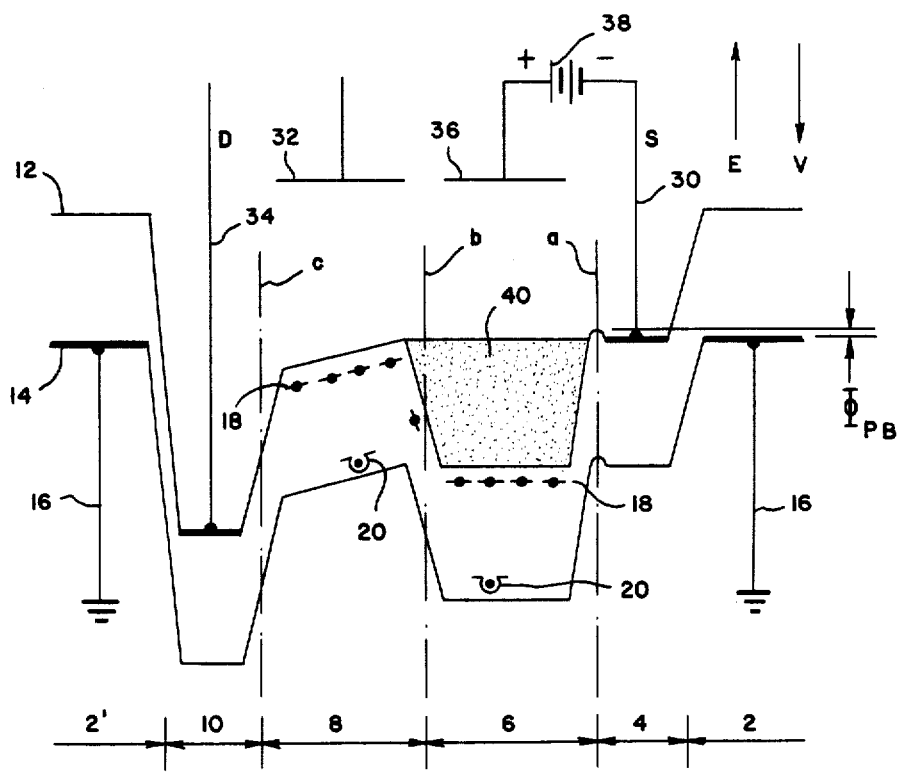

FIG. 5 shows the device of FIG. 4 with potentials applied to place the device in the conductive condition. Even though the energy contours of the conduction band edge (12) and the valence band edge (14) in FIG. 5 are identical with those in FIG. 2, the potential on the control gate (32) is substantially different because the donor impurity band (18) has replaced the acceptor impurity band (24) within the channel region (8).

Figure 6:
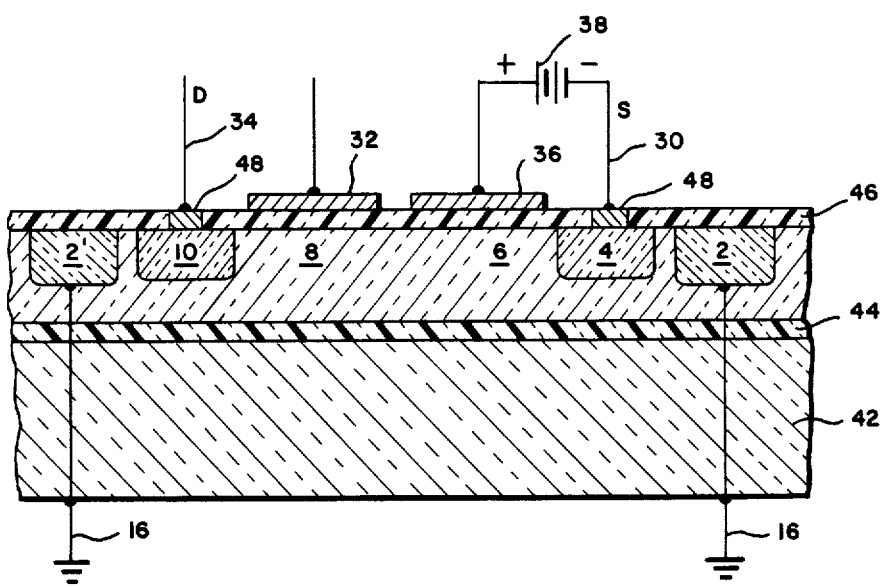
FIG. 6 is a schematic cross-section diagram of the device of FIGS. 4 and 5.

FIG. 6 is a schematic cross-section diagram through the alternatively-constructed device described functionally above with reference to FIGS. 4 and 5. Though the weak-N type weak-source region material (6) and the weak-N type channel region material (8) are shown extended throughout the device, the intrinsic layer (44) is retained as a thin layer between the weak-N type materials (6, 8) and the P+ type substrate material (42) because it is a good practice which acts to prevent any unwanted tunnelling conduction between the layers.

While the above discussion has been in terms of an FET, it is an obvious extrapolation to use a plurality of control gates to form a CCD configuration of the present invention using the weak-source. Such obvious extrapolations are intended to be included as obvious alternative embodiments.

It should further be understood that no preferred fabrication scenario has been specified. Any conventional fabrication process which results in the described configuration may be used.

The foregoing descriptions assume an N type device built on a P type substrate. Obviously complementary P type devices built on N type substrates are also possible and are intended to be encompassed as other obvious alternative embodiments. Similarly, only simple side-by-side gates have been shown, but the obvious use of overlapping gates, two-phase implanted gates, or such other gate structures as may be convenient should also be deemed to be possible obvious alternative embodiments, even though not discussed in detail.

Accordingly, the scope of the present invention should not be deemed as limited by any particular aspect of the particular embodiments described and illustrated herein, but rather only by the broad scope of the appended claims in which the literal significance of various recited particular elements is to be construed as encompassing (but not limited to) those equivalents and alternative embodiments briefly discussed above.

I claim:

1. A cryogenic semiconductor device comprising:
   a substrate of a first conductivity type;
   a source region;
   a drain region spaced apart from said source region, said source region and said drain region each being of a second conductivity type;
   a weak-source region contiguous to said source region and also of said second conductivity type but having a lower concentration of carriers than in said source region;
   a channel region between said weak-source region and said drain region;
   a dielectric layer extending above said weak-source region and said channel region;
   at least one control gate electrode above said channel region and separated therefrom by said dielectric layer for selectively inducing within said channel region an induced channel of said second conductivity type extending from weak-source region to said drain region;
   at least one weak-source gate electrode above said weak-source region and separated therefrom by said dielectric layer; and
   means for applying a predetermined voltage potential between said source region and said weak-source gate electrode to create a potential bucket connecting said source region with said induced channel.

2. The device of claim 1 further comprising a layer of intrinsic semiconductor material above said substrate and beneath said source, weak-source, channel and drain regions.

3. The device of claim 1 or claim 2 wherein said channel region is of said first conductivity type.

4. The device of claim 3 wherein said channel region has a lower concentration of carriers than does said substrate.

5. The device of claim 4 wherein the same semiconductor material that forms said channel region also separates said source, weak-source and drain regions from said substrate.

6. The device of claim 4 wherein the same semiconductor material that forms said weak-source region also separates said source, channel and drain regions from said substrate.

7. The device of claim 1 or claim 2 wherein said channel region is of said second conductivity type.

8. The device of claim 7 wherein the same semiconductor material that forms said channel region also forms said weak-source region.

9. The device of claim 8 wherein said same semiconductor material also separates said source and drain regions from said substrate.

10. The device of claim 8 wherein said same semiconductor material extends across said device into an infrared detector device on said substrate and functions as a photosensitive material within said detector device.

* * * * *